US008295507B2

(12) United States Patent
Mitsufuji et al.

(10) Patent No.: US 8,295,507 B2
(45) Date of Patent: Oct. 23, 2012

(54) FREQUENCY BAND EXTENDING APPARATUS, FREQUENCY BAND EXTENDING METHOD, PLAYER APPARATUS, PLAYING METHOD, PROGRAM AND RECORDING MEDIUM

(75) Inventors: Yuhki Mitsufuji, Tokyo (JP); Toru Chinen, Kanagawa (JP); Hiroyuki Honma, Chiba (JP); Kenichi Makino, Kanagawa (JP)

(73) Assignee: Sony Corporation, Tokyo (JP)

( * ) Notice: Subject to any disclaimer, the term of this patent is extended or adjusted under 35 U.S.C. 154(b) by 1288 days.

(21) Appl. No.: 11/935,625

(22) Filed: Nov. 6, 2007

(65) Prior Publication Data

US 2008/0129350 A1 Jun. 5, 2008

(30) Foreign Application Priority Data

Nov. 9, 2006 (JP) ................................ 2006-304501
Oct. 22, 2007 (JP) ................................ 2007-274091

(51) Int. Cl.
*H03G 5/00* (2006.01)

(52) U.S. Cl. ........................................................ 381/98

(58) Field of Classification Search .................... 381/61, 381/94.1, 94.5, 94.7, 98, 106; 333/14; 455/72; 700/94
See application file for complete search history.

(56) References Cited

U.S. PATENT DOCUMENTS

| | | | | |
|---|---|---|---|---|
| 6,836,739 | B2 * | 12/2004 | Sato | 702/76 |
| 7,715,573 | B1 * | 5/2010 | Yonemoto et al. | 381/98 |
| 2004/0078194 | A1 * | 4/2004 | Liljeryd et al. | 704/200.1 |

FOREIGN PATENT DOCUMENTS

| | | | |
|---|---|---|---|
| EP | 1669981 | A1 | 6/2006 |
| JP | 2003-140696 | | 5/2003 |
| JP | 2004-198485 | | 7/2004 |
| JP | 2005-128387 | | 5/2005 |
| JP | 2006-031053 | | 2/2006 |
| WO | WO0241302 | A1 | 5/2002 |
| WO | WO2004081918 | A1 | 9/2004 |

OTHER PUBLICATIONS

European Search Report mailed Oct. 31, 2011 issued in related European Application EP 07254421.6-1224 / 1921610, Sony Corporation.

European Patent Office Communication pursuant to Article 94(3) EPC, European search opinion for Application No. 07254421.6, mailed Nov. 10, 2011, Sony Corporation.

Yasukawa, Hiroshi, Restoration of Wide Band Signal From Telephone Speech Using Linear Prediction Error Processing, Spoken Language, IICSLP 96, IEEE,1996.

Chi-Min Liu, High Frequency Reconstruction for Band-Limited Audio Signals, Proc. of the 6th Int. Conference on Digital Audio Effects (DAFX-03), London, UK, Sep. 2003.

* cited by examiner

*Primary Examiner* — Devona Faulk
*Assistant Examiner* — David Ton
(74) *Attorney, Agent, or Firm* — Finnegan, Henderson, Farabow, Garrett & Dunner, L.L.P.

(57) ABSTRACT

A player apparatus for playing an input signal after band-extending the input signal includes: an extension controller to determine an extension start band for the input signal in accordance with information relating to the input signal; and a band divider to divide the input signal into a plurality of sub-band signals. The frequency band is extended on the basis of a plurality of the sub-band signals on a side lower than the extension start band, among the plurality of sub-band signals into which the input signal is band-divided by the band divider.

11 Claims, 10 Drawing Sheets

FIG. 2

| ENCODING SYSTEM | SAMPLING RATE [Hz] | BIT RATE [kbps] | EXTENSION START FREQUENCY BAND sb |
|---|---|---|---|
| ENCODING SYSTEM A | 22050 | 64-96 | 8 |
| | 44100 | 96-128 | 9 |
| | | 128-192 | 10 |
| | | 192-256 | 11 |
| ENCODING SYSTEM B | 44100 | 48-64 | 8 |
| | | 64-96 | 9 |
| | | 96-128 | 10 |
| | | 128-256 | 11 |
| ENCODING SYSTEM C | 32000 | 48-96 | 8 |
| | 44100 | 96-160 | 10 |
| | | 160-224 | 11 |

FREQUENCY BAND EXTENDING APPARATUS, FREQUENCY BAND EXTENDING METHOD, PLAYER APPARATUS, PLAYING METHOD, PROGRAM AND RECORDING MEDIUM

BACKGROUND OF THE INVENTION

1. Field of the Invention

The present invention relates to a frequency band extending apparatus, a frequency band extending method, a player apparatus, a playing method, a program for causing a computer to execute reproducing processing, and a recording medium on which the program is recorded, all being capable of playing encoded data, which is encoded after deleting high frequency band, with higher sound quality.

2. Description of Related Art

In recent years, music distributing services, which provide encoded data such as MP3 (International Standard ISO/IEC 11172-3, MPEG Audio Layer 3), have become increasingly popular. In most of these services, encoded data whose bit rate is reduced is distributed so that it does not take time in downloading the data.

Encoded data of a low bit rate is often encoded by deleting component of signal belonging to high frequency band of 15 kHz or more, which is hardly audible by human ears. As a result, the data becomes small in file size. However, the deletion of the high frequency band signal leads to issues such as loss of "realism" which would otherwise be provided by an original signal and muffled sounds.

To cope with these issues, in an encoding system, such as HE-AAC (International Standard ISO/IEC 14496-3, High Efficiency MPEG4 AAC), a band extension technology is used to generate component of signal belonging to a higher frequency band of about 15 kHz or more, to thereby reproduce higher frequency component close to an original signal. Also, in recent years, a post-processing band extension technology or the like is employed to reproduce higher frequency component close to an original signal. In this technology, a signal obtained by subjecting data, which is encoded by deleting component of signal belonging to a higher frequency band, to decoding processing is inputted and the higher frequency band is interpolated.

For example, in a technique proposed in Japanese Patent Application Publication No. JP 2004-184472 (Patent Reference 1), a high frequency band signal is generated by mixing an input signal with a local oscillation signal, and the band is interpolated by adding the input signal and a higher frequency component filtered with a passband characteristic depending an encoding system or a type of music. In a technique proposed in Japanese Patent Application Publication No. JP 2002-175092 (Patent Reference 2), for attaching the higher frequency band signal component, an input signal is transformed by Fourier transformation into the frequency domain, an envelope for a higher frequency band is estimated from a frequency spectrum of a low frequency band, and a gain of the frequency spectrum of the low frequency band is adjusted so as to fit the envelope.

SUMMARY OF THE INVENTION

However, in the technique proposed in Patent Reference 1, there is a limit to the types of passband characteristics which a high-pass filter learns in advance, so that flexibility in gain adjustment for the higher frequency band cannot be obtained. Furthermore, in the technique proposed in Patent Reference 2, the input signal is Fourier-transformed to have its amplitudes adjusted in the frequency domain, and the resultant signal is then inverse Fourier-transformed to obtain a time-domain signal. However, this technique raises an issue of time-domain aliasing dependent on Fourier transformation lengths.

Furthermore, in Japanese Patent No. 3538122 (Patent Reference 3), these issues are avoided by using a band dividing filter. FIG. 10 is a block diagram of a related-art player apparatus proposed in Patent Reference 3. In this technique, an input PCM (Pulse-Code Modulation) signal is decomposed into a plurality of sub-band signals at a band dividing section 101. Subsequently, at an envelope estimating section 102, a frame-based frequency envelope is estimated, and at a high frequency band generating section 103, a sub-band signal belonging to a higher frequency band is generated. Finally, the band-extended sub-band signal is supplied to a band combining section 104, and a band-extended PCM signal is outputted.

However, the above-mentioned technique proposed in Patent Reference 3 raises three issues. First, as a result of processing performed with a unit of certain number of frames, generation of a higher frequency band signal which follows temporal fluctuation within a single frame of the input signal is not performed. Second, when an extremely large signal is inputted, a higher frequency band signal is calculated to be very large accordingly, so that an output from a band combining filter may overflow. Third, in the post-processing band extension technology in which a signal obtained by decoding encoded data is inputted and the high frequency band is interpolated, an extension start frequency band for band extension is unknown.

In view of the above and other issues, it is desirable to provide a frequency band extending apparatus, a frequency band extending method, a player apparatus, a playing method, a program for causing a computer to execute reproducing processing, and a recording medium on which the program is recorded, all being capable of playing encoded data, which is encoded by deleting component of signal belonging to a higher frequency band, with higher sound quality.

In one embodiment of the present invention, there is provided a frequency band extending apparatus for extending a frequency band of an input signal. The apparatus includes extension control means for determining an extension start band for the input signal, and band dividing means for dividing the input signal into a plurality of sub-band signals. In the frequency band extending apparatus, the frequency band is extended on the basis of a plurality of the sub-band signals on a side lower than the extension start band, among the plurality of sub-band signals into which the input signal is band-divided by the band dividing means.

In another embodiment of the present invention, there is provided a frequency band extending method for extending a frequency band of an input signal. The method includes: determining an extension start band for the input signal in accordance with information relating to the input signal, dividing the input signal into a plurality of sub-band signals, and extending the frequency band on the basis of a plurality of sub-band signals on a side lower than the extension start band, among the plurality of sub-band signals into which the input signal is band-divided in the band dividing step.

In still another embodiment of the present invention, there is provided a player apparatus for playing an input signal after band-extending the input signal. The player apparatus includes extension control means for determining an extension start band for the input signal in accordance with information relating to the input signal, and band dividing means for dividing the input signal into a plurality of sub-band signals. In the player apparatus, the frequency band is extended on the basis of a plurality of the sub-band signals on a side lower than the extension start band, among the plurality of sub-band signals into which the input signal is band-divided by the band dividing means.

In still another embodiment of the present invention, there is provided a playing method for playing an input signal after band-extending the input signal. The method includes: determining an extension start band for the input signal in accordance with information relating to the input signal, dividing the input signal into a plurality of sub-band signals, and extending the frequency band on the basis of a plurality of sub-band signals on a side lower than the extension start band, among the plurality of sub-band signals into which the input signal is band-divided in the band dividing step.

In still another embodiment of the present invention, there is provided a program for causing a computer to execute a process of playing an input signal after band-extending the input signal. The program includes an extension control step of determining an extension start band for the input signal in accordance with information relating to the input signal, a band dividing step of dividing the input signal into a plurality of sub-band signals, and a frequency band extending step of extending the frequency band on the basis of a plurality of the sub-band signals on a side lower than the extension start band, among the plurality of sub-band signals into which the input signal is band-divided in the band dividing step.

In yet another embodiment of the present invention, there is provided a recording medium on which a program for causing a computer to execute a process of playing an input signal after band-extending the input signal is recorded. The program includes an extension control step of determining an extension start band for the input signal, a band dividing step of dividing the input signal into a plurality of sub-band signals, and a frequency band extending step of extending the frequency band on the basis of a plurality of the sub-band signals on a side lower than the extension start band, among the plurality of sub-band signals into which the input signal is band-divided in the band dividing step.

According to the above-mentioned embodiments of the present invention, the extension start band for the input signal can be determined, and the frequency band can be extended on the basis of the plurality of sub-band signals on the side lower than the extension start band. Accordingly, the input signal can be played back with higher sound quality.

BRIEF DESCRIPTION OF THE DRAWINGS

FIG. 2 is a diagram showing a relationship between side information and extension start frequency bands "sb";

DETAILED DESCRIPTION OF THE EMBODIMENT

Specific embodiments of the present invention will be described below in detail with reference to the accompanying drawings. These embodiments allow to play an input signal with higher sound quality.

Figure 1:
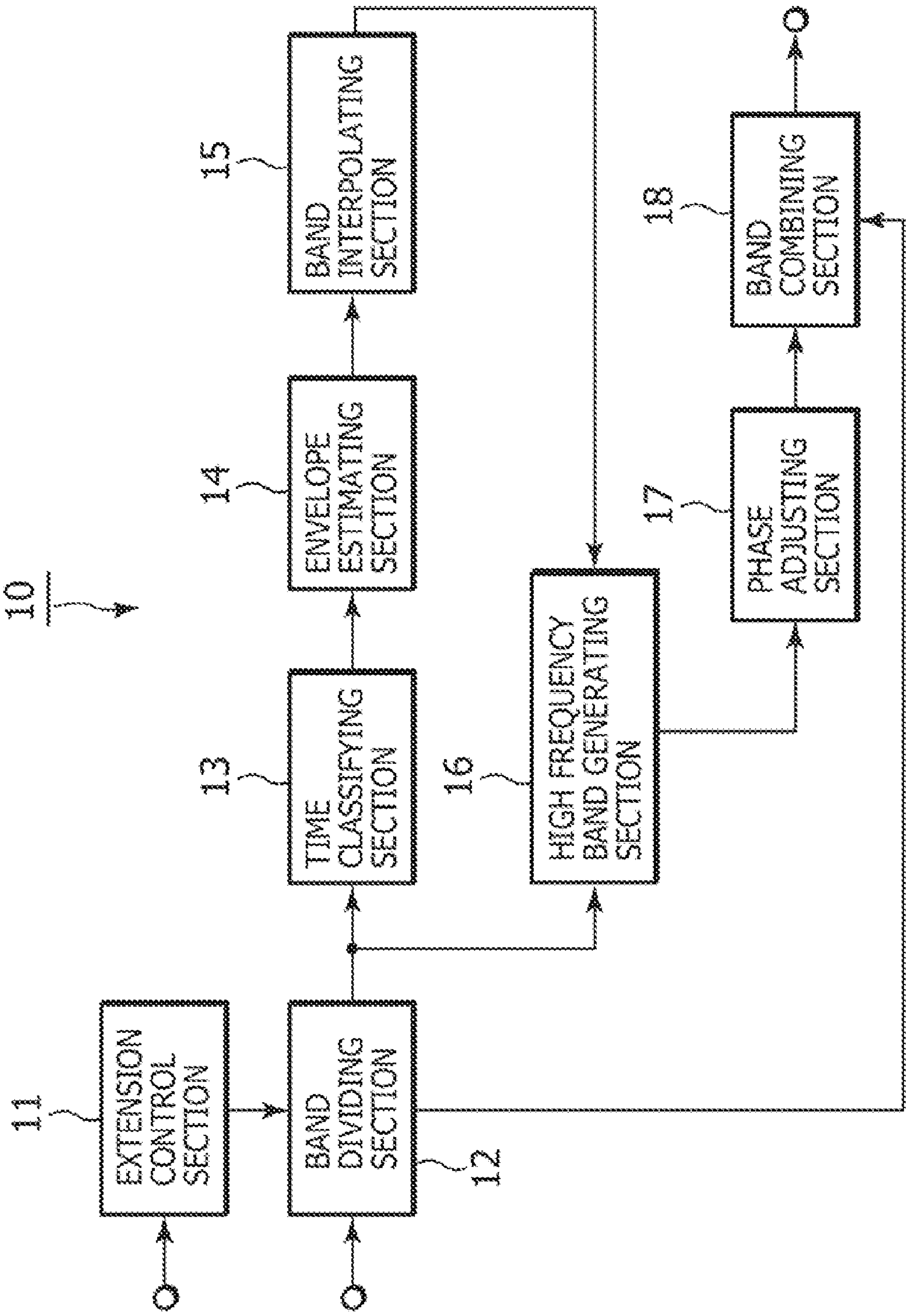
FIG. 1 is a block diagram showing a configuration of a frequency band extending apparatus according to an embodiment.

FIG. 1 is a block diagram showing a configuration of a frequency band extending apparatus 10 according to an embodiment. The frequency band extending apparatus 10 includes an extension control section 11, a band dividing section 12, a time classifying section 13, an envelope estimating section 14, a band interpolating section 15, a high frequency generating section 16, a phase adjusting section 17, and a band combining section 18.

The extension control section 11 is supplied with side information relating to an input signal, such as a type of encoding system, a sampling rate, and a bit rate, determines an extension start frequency band on the basis of this side information, and supplies the determined extension start frequency band to the band dividing section 12. Alternatively, the side information may be a value preset in accordance with the type of encoding system of the input signal, or may be any arbitrary user-designated value.

The band dividing section 12 divides the input signal into a plurality of sub-band signals. Subsequently, the band dividing section 12 supplies a plurality of sub-band signals on a side lower than the extension start frequency band (hereinafter referred to as "low-range sub-band signals"), among the plurality of generated sub-band signals, to the band combining section 18. Further, the band dividing section 12 supplies a plurality of sub-band signals (hereinafter referred to extension-low-range sub-band signals) on a side close to the extension start frequency band, among the plurality of low-range sub-band signals, to the time classifying section 13 and the high frequency generating section 16.

The time classifying section 13 performs transient detection on the extension-low-range sub-band signals in a temporal direction, put the extension-low-range sub-band signals into groups in the temporal direction, generates average sample powers for each of the groups of the extension-low-range sub-band signals, and supplies the average sample powers to the envelope estimating section 14.

The envelope estimating section 14 obtains a group power for each of the groups from the sum of the average sample powers generated at the time classifying section 13, and calculates an average of the group powers for the extension-low-range sub-band signals as a whole. Subsequently, with the group power average as a starting point, envelope values for sub-bands equal to or on a side higher than the extension start frequency band is estimated, and supplies the estimated envelope values to the band interpolating section 15.

The band interpolating section 15 calculates gain adjusting values for connection from the extension-low-range sub-band signals to the sub-band signals on the high-range side, from the envelope values for the sub-bands on the high-range side and envelope values for the sub-bands on the low-range side, and supplies the calculated gain adjusting values to the high frequency generating section 16.

The high frequency generating section 16 multiplies the gain adjusting values for the sub-band signals on the high-range side, with the extension-low-range sub-band signals to generate sub-band signals on the high-range side, and supplies the generated sub-band signals on the high-range side to the phase adjusting section 17.

The phase adjusting section 17 shifts the phase of the sub-band signals on the high-range side generated by the high frequency generating section 16, and supplies the phase-shifted sub-band signals on the high-range side to the band combining section 18.

The band combining section 18 combines bands of the sub-band signals on the high-range side supplied thereto from the phase adjusting section 17, with the low-range sub-band signals supplied thereto from the band dividing section, and outputs the resultant band-extended signal.

By using the side information relating to the input signal in this way, the extension start frequency band for band extension can be determined with high accuracy. In addition, since the sub-band signals on the side higher than the extension start frequency band are generated on the basis of the extension-low-range sub-band signals close to the extension start frequency band, the frequency band can be extended in higher sound quality. Furthermore, by shifting the phase of the generated sub-band signals on the high-range side, overflow can be prevented.

Various components of the above-described frequency band extending apparatus will be described below in more detail.

Extension Control Section

The extension control section 11 determines an extension start frequency band on the basis of side information relating to an input signal. The side information includes a type of encoding system, a sampling rate, and a bit rate. Alternatively, the side information may be a value preset in accordance with the type of encoding system of the input signal, or may be any arbitrary user-designated value.

Typically, a frequency band to which an input signal belongs is correlated with various side information such as the type of encoding system, sampling rate, and bit rate. Accordingly, in the present embodiment, the frequency band to which the input signal belongs is estimated by using this side information, and an extension start frequency band sb for interpolating the frequency band is determined. The determined extension start frequency band sb is supplied to the band dividing section 12.

FIG. 2 is a diagram showing a relationship between side information and extension start frequency bands sb. An example shown in FIG. 2 is a case where a frequency band to which an input signal belongs is divided into sixteen sub-bands. The extension start frequency band sb (sb is any of constants ranging from 0 to 15) is determined in accordance with the encoding system, sampling rate, and bit rate. For example, supposing that the side information indicates that the encoding system is B, the sampling rate is 44100 Hz, and the bit rate is 64-96 kbps, the extension start frequency band sb is determined to be 9. Factors for determining the side information may include differences between Stereo/Mono, CBR/VBR, and the like.

Band Dividing Section

The band dividing section 12 divides an input signal x(n) into sixteen sub-band signals x(ib,n) (ib=0 to 15, where a larger ib indicates a higher-range sub-band signal). Among these sixteen sub-band signals x(ib, n), the band dividing section 12 supplies sub-band signals x(ib,n) belonging to sub-bands ranging from a sub-band 0 to a sub-band sb-1 which is one sub-band preceding the extension start frequency band (hereinafter referred to as "sb"), to the band combining section 18, and also supplies sub-band signals x(ib,n) belonging to sub-bands from sb-4 to sb-1, to the time classifying section 13 and the high frequency generating section 16.

It is described in the present embodiment that the input signal x(n) is divided into sixteen sub-band signals x(ib, n). However, the number of sub-bands into which the input signal is divided is not limited thereto.

Time Classifying Section

The time classifying section 13 classifies the signal into a different group every time it detects a transient in the temporal direction, such as a rise or a fall of a sound, and interpolates high frequency bands for each of the groups. With this arrangement, it is possible to prevent sound quality degradation in acoustic signals in natural environments which have non-steady states and steady states and have different gains and frequency characteristics. Meanwhile, in the technology disclosed in Patent Reference 3, frame processing is performed, and processing is performed in units of frames to interpolate a high frequency band. Namely, with that technology, a high frequency band is interpolated without separating acoustic signals in natural environments therefrom nor considering temporal fluctuations. This may hence cause sound quality degradation.

Time Division and Calculation of Power Envelope

The sub-band signals x(ib,n) from sb-4 to sb-1 on the low-range side supplied from the band dividing section 12 are used as input. Each of the sub-band signals x(ib,n) is divided into sixteen segments, each of which is a unit called a slot. Subsequently, an average sample power per sample, power (ib,islot), is calculated for each slot. The number of samples for each slot is set to eight.

[Formula 1]

$$\text{power}(ib, islot) = \frac{1}{8}\sum_{n=0}^{n<8}(x(ib, islot*8+n)*x(ib, islot*8+n)) \tag{1}$$

$$islot = 0, 1, 2 \ldots 15 \ (islot\text{: current slot})$$

Grouping by Transient Detection

In the sub-band signals from sb-4 to sb-1 on the low-range side, the average sample powers, power(ib,islot), are compared in the temporal direction (before and after along the time axis) for each of all the sixteen slots, to perform the transient detection for detecting a rise and a fall. The term "transient detection" herein used means detections of a location where an average sample power exhibits a large fluctuation in the temporal direction.

A ratio, ratio, of an average sample power of a slot in search to an average sample power, power(ib,islot−1), of a slot preceding the slot in search is calculated. Subsequently, by judging as a rise when the ratio is equal or larger than 16 Limes, and by judging as a fall when the ratio is equal to or less than 1/16 (=0.0625) times, slots starting from a slot in which the transient is detected temporally in the past to a slot next to a slot in which the current transient is detected are formed into a single group.

When a rise or fall is detected in a certain sub-band ib, it is supposed that the rise or fall is detected in all the sub-band signals from sb-4 to sb-1 on the low-range side.

[Formula 2]

$$\text{ratio}(ib,\ islot) = \frac{\text{power}(ib,\ islot)}{\text{power}(ib,\ islot-1)} \tag{2}$$

$$\left\{\begin{array}{l} \text{ratio}(ib,\ islot) > 16 \ldots \text{rise detected} \\ \text{ratio}(ib,\ islot) < 0.0625 \ldots \text{fall detected} \\ 0.0625 \le \text{ratio}(ib,\ islot) \le 16 \ldots \text{none} \end{array}\right\}$$

$$(islot\text{: current slot})$$

As a result, the grouping is performed in which temporal fluctuations are considered, so that it is possible to generate high frequency band components closer to acoustic signals in natural environments, and hence to produce higher-quality sounds.

In this embodiment, each of the sub-band signals x(ib,n) from sb-4 to sb-1 on the low-range side supplied from the band dividing section is divided into sixteen segments in the temporal direction, each segment being a unit called a slot. However, the dividing number in the temporal direction is not limited. In addition, while a single slot includes eight samples, the dividing number in the temporal direction and the number of samples in a single slot are not limited. Furthermore, while it is judged as a rise when a ratio for the transient detection is equal to or larger than 16 times, and it is judged as a fall when the ratio is equal to or less than 1/16 (=0.0625) times, 16 and 1/16 (=0.0625) being threshold values for detection of a rise and a fall may be changed in response to the band dividing number, the dividing number in the temporal direction, or the like.

Determination of Sub-Band for Transient Detection

Figure 3:
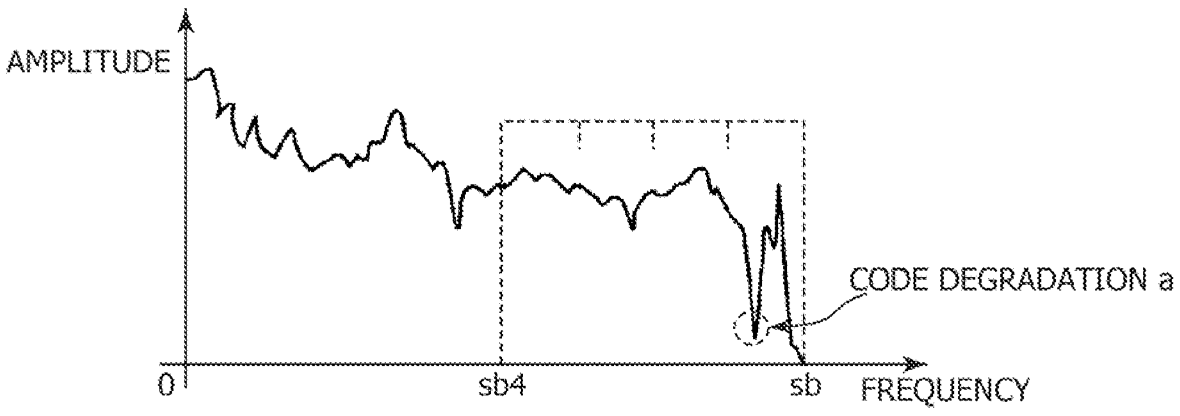
FIG. 3 is a diagram showing frequency-amplitude characteristics in a case of severe code corruption.

In the grouping of encoded signals suffering from code corruption, the accuracy of temporal fluctuations is dependent on a degree of corruption in the low-range sub-band signals which is subjected to the transient detection. FIG. 3 is a diagram showing frequency-amplitude characteristics in a case of severe code corruption. As shown in FIG. 3, a severe code corruption "a" is seen as holes on the frequency axis, and the time classifying section 13 interprets the hole as a damped state of a signal. Hence, there is an issue that the time classifying section 13 erroneously detects a transient even at a location in the original signal where there is no transient. As a result, sound quality degrades due to reduced accuracy of grouping, and additionally, calculation volume increases due to such a transient detection.

In view of these issue, in the present embodiment, the maximums of average sample powers are compared for each sub-band to judge whether or not a sub-band is necessary for the transient detection. The actual transient detection is performed thereafter. In addition, the transient detection is not performed in a case where all the sub-bands include extremely small signals, in order to prevent calculation volume from increasing due to temporal fluctuations in an inaudible range being picked up.

Figure 4:
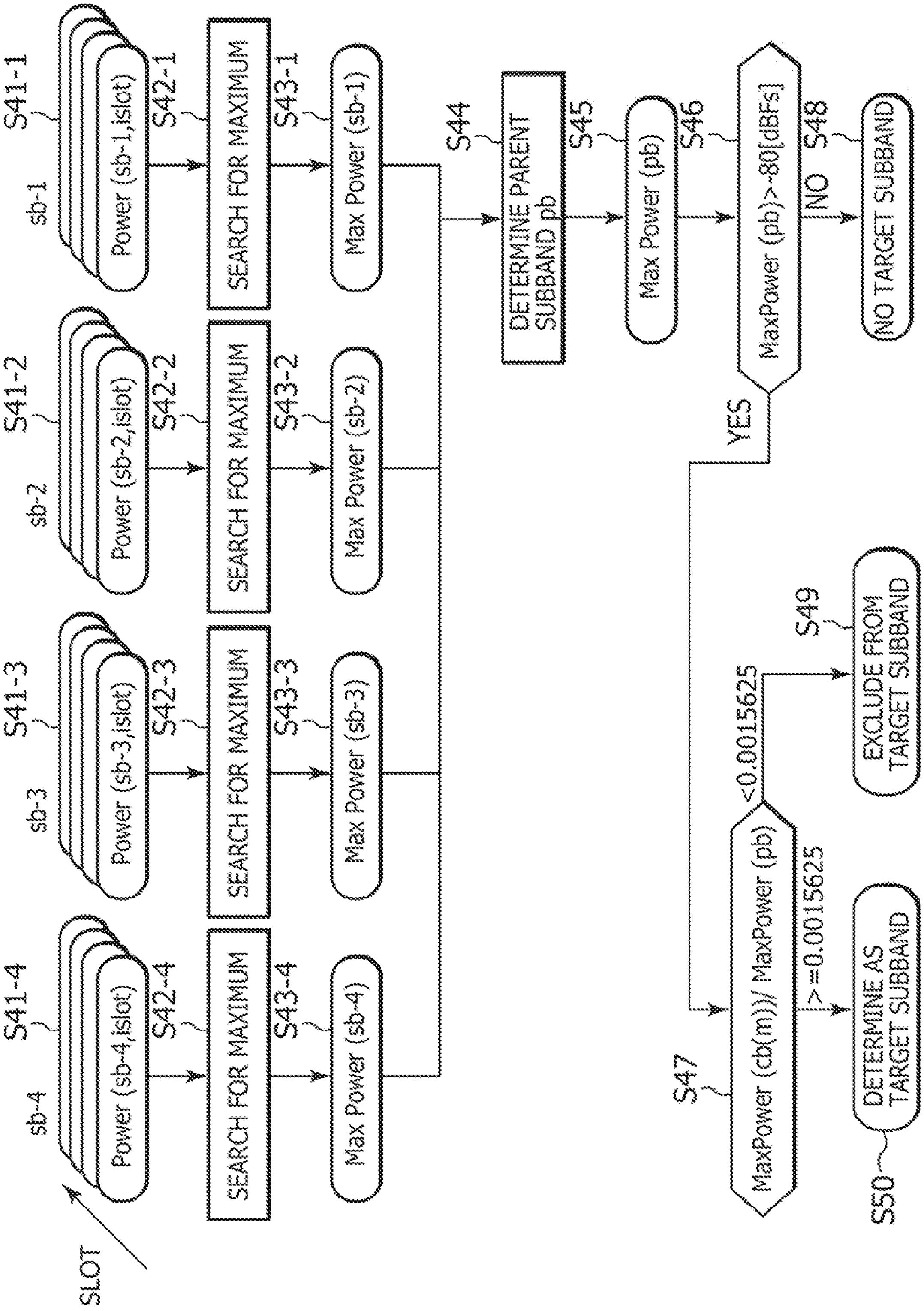
FIG. 4 is a flowchart showing a processing flow for determining a sub-band for transient detection.

FIG. 4 is a flowchart showing a processing flow for determining a sub-band for the transient detection.

In steps S41 to S43, in each of the four sub-band signals from sb-4 to sb-1 on the low-range side, a maximum of the average sample powers, power(ib,islot), of its total sixteen slots is searched, and the maximum is set as a representative value max power(ib) of that sub-band.

In step S44, among the four representative values max power(ib) (ib=sb-4, sb-3, sb-2, sb-1), obtained respectively for the four sub-bands on the low-range side, a sub-band having the maximum is set as a parent sub-band pb, and the remaining sub-bands are set as child sub-bands cb(0), cb(1), cb(2). A representative value of the parent sub-band is set as max power(pb) (step S45).

If it is judged in step S46 that the representative value max power (pb) of the parent sub-band equals a level not less than −80[dBFs] based on a 16-bit full scale reference, the process proceeds to step S47.

On the other hand, if the representative value max power (pb) of the parent sub-band equals a level less than −80 [dBFs] based on the 16-bit full scale reference, transient detection-based grouping in the temporal direction is not performed on any of the four sub-bands on the low-range side. This means that there is no sub-band for the transient detection (step S48). As a result, the transient detection is skipped for any small signals, thereby preventing the amount of unnecessary calculations from increasing.

If it is judged in step S47 that max power(ib) is equal to or larger than −80[dBFs] and that a representative value max power (cb(m)) of a certain child sub-band cb(m) relative to the representative value max power(pb) of the parent sub-band pb equals a value Less than 0.0015625 times, the process proceeds to step S49, in which no transient detection is performed on this sub-band at all.

On the other hand, if max power(ib) is equal to or larger than −80[dBFs] and if a representative value max power (cb(m)) of a certain child sub-band cb(m) relative to the representative value max power (pb) of the parent sub-band pb equals to or larger than 0.0015625 times, the process proceeds to step S50, to perform the transient detection on this sub-band. The parent sub-band pb is also included in the target sub-bands for the transient detection.

[Formula 3]

$$\text{ratio} = \frac{\text{power}(cb(m))}{\text{power}(pb)} \tag{3}$$

$$\left\{\begin{array}{l} \text{ratio} \ge 0.0015625 \ldots subband \text{ for transient detection} \\ \text{ratio} < 0.0015625 \ldots subband \text{ not for transient detection} \end{array}\right\}$$

$$\left(\begin{array}{l} cb(m)\text{: child } subband \\ pb\text{: parent } subband \end{array}\right)$$

As a result, by preventing code corruption-caused erroneous detection of temporal fluctuations and by reproducing a temporal envelope closer to natural acoustic signals, it is possible to reproduce higher-quality sounds. The average sample powers power (ib, islot) of the four sub-bands ib on the low-range side, sb-4 to sb-1, generated at the time classifying section 13 are supplied to the envelope estimating section 14.

It should be noted that, in the present embodiment, the transient detection is not performed on a sub-band which has a ratio for the transient detection less than 0.0015625 times. However, the threshold value for the transient detection, 0.0015625, may be changed in response to the band dividing number, the dividing number in the temporal direction, or the like.

Envelope Estimating Section

The envelope estimating section 14 first obtains a group power for each group from the sum of the average sample powers, power(ib,islot), generated at the time classifying section 13, and calculates an average of the group powers of the sub-band signals from sb-4 to sb-1 on the low-range side. Subsequently, with the group power average of these sub-bands on the low-range side as a starting point, envelope values for sub-bands from sb to 15 on the high-range side are estimated by extrapolation based on a first-order linear line. When the first-order linear line for the envelope values is expressed as ax+b, a reference point b is obtained by calculation of envelope reference values based on later-described weighted averaging, and a slope a is obtained by a later-described envelope slope value a_lev.

Calculation of Group Powers

The envelope estimating section 14 uses the average sample powers, power(ib,islot), of the four sub-bands ib on the low-range side, sb-4 to sb-1, supplied thereto from the time classifying section 13 as input. In each of the sub-bands ib, a total of as many average sample powers, power (ib, islot), as the number of slots nslot(ig), present in each group is calculated for each group, and set the total as a group power tpow(ib,ig) where ig designates a current group and there is a maximum of 16 groups.

[Formula 4]

$$tpow(ib, ig) = \sum_{islot=0}^{islot<nslot(ig)} \text{power}(ib, islot) \tag{4}$$

$$\left(\begin{array}{l} tpow\text{: group power} \\ ig\text{: current group} \\ nslot\text{: number of slots in certain group} \end{array}\right)$$

Calculation of Envelope Reference Values by Weighted Averaging

From the group powers tpow (ib,ig) in the respective groups obtained by the formula (4), an average is obtained for the entire sub-band signals from sb-4 to sb-1 on the low-range side. Here, by using weighted averaging to obtain the average and thus assigning a larger weight to a sub-band closer to sb, the present embodiment allows that an envelope on the low-range side can connect to an envelope on the high-range side more smoothly.

Figure 5A:
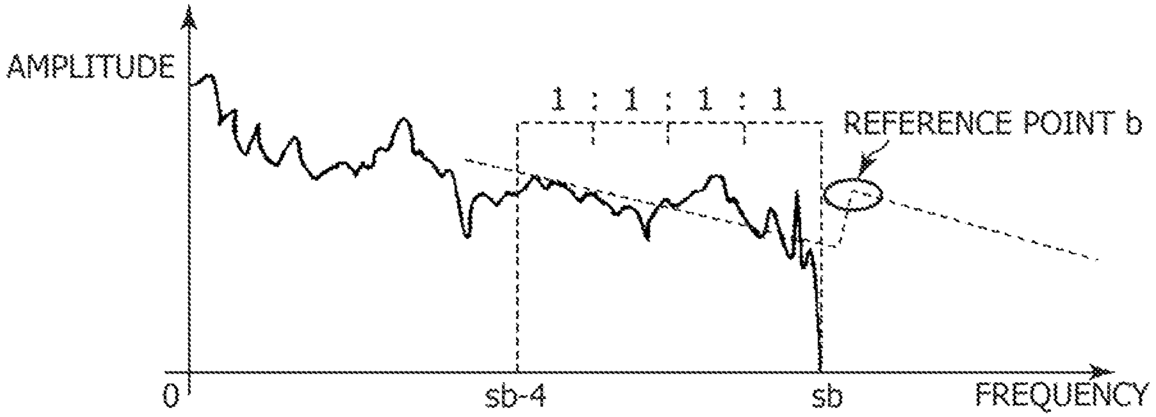
FIGS. 5A and 5B are schematic diagrams respectively showing envelope reference values based on different averaging methods.
Figure 5B:
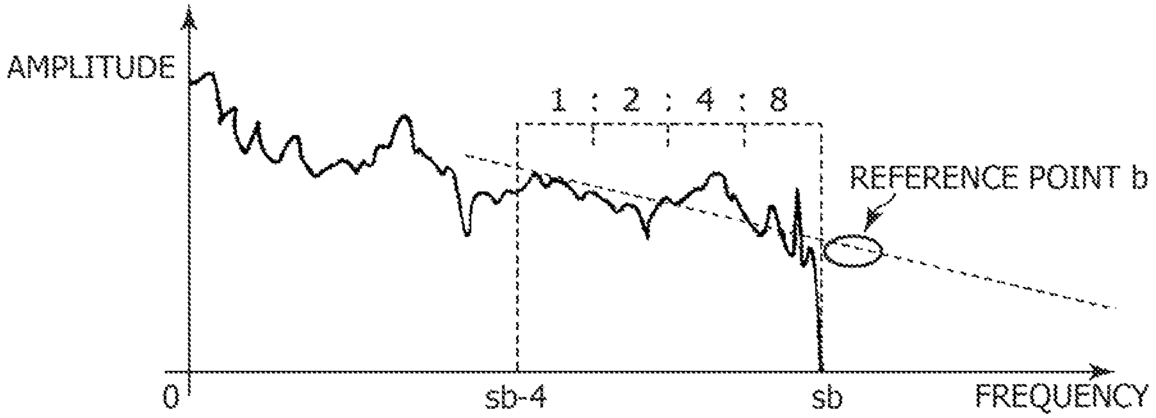

FIGS. 5A and 5B are schematic diagrams respectively showing envelope reference values based on different averaging methods. Here, differences resulting from different averaging methods will be described as to a case where the group power tpow(sb-1,ig) of the sub-band sb-1 adjacent to sb is small compared with those of the remaining sub-bands, such as shown in FIGS. 5A and 5B.

Using an average of values each having an equal weight, the reference point b to be calculated later from the average is calculated to be large in value, due to the influence of the magnitudes of the group powers tpow (ib,ig) of the remaining three sub-bands remote from sb, as shown in FIG. 5A. As a result, the sub-band sb-1 and the sub-band sb do not connect smoothly, thereby leading to sound quality degradation.

On the other hand, in the present embodiment, an average is calculated by assigning a larger weight to a sub-band closer to sb as shown in FIG. 5B, so that the frequency envelopes can be connected smoothly.

Figure 6:
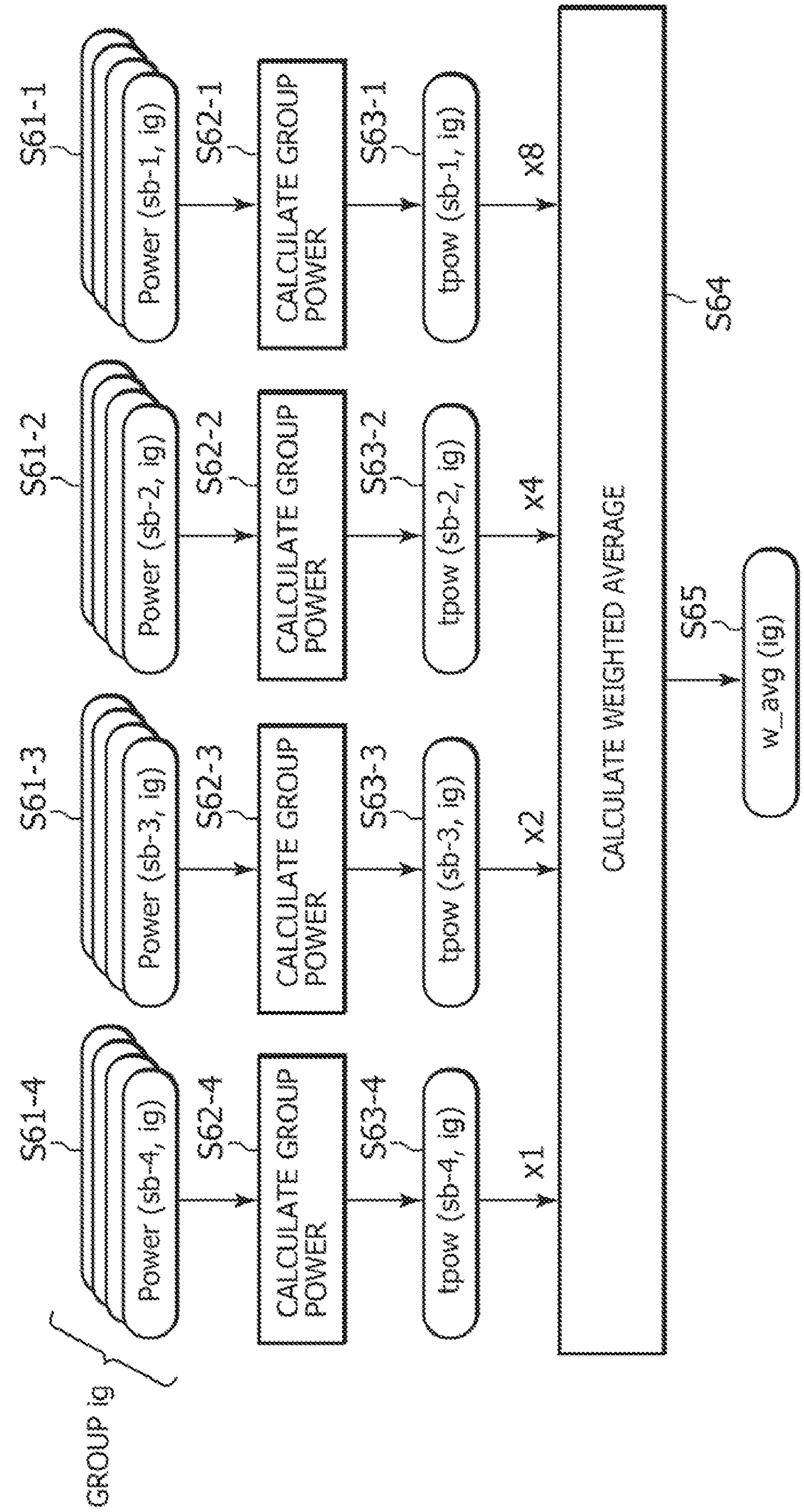
FIG. 6 is a flowchart showing a processing flow for calculating the envelope reference values based on weighted averaging.

FIG. 6 is a flowchart showing a processing flow for calculating an envelope reference value by weighted averaging. In steps S61 to S63, the group powers tpow(ib,ig) for the four sub-band signals from sb-4 to sb-1 on the low-range side are calculated, respectively. Subsequently, the weighted averaging is performed on the group powers tpow(ib,ig) at a ratio of, e.g., 8:4:2:1 in order of the sub-bands closer to sb (step S64), to obtain a weighted average w_avg(ig) (step S65).

[Formula 5]

$$\text{w\_avg}(ig) = 1/15 * (8 * tpow(sb-1, ig) + 4 * tpow(sb-2, ig) + 2 * tpow(sb-3, ig) + 1 * tpow(sb-4, ig)) \tag{5}$$

(w_avg: weighted average)

Subsequently, using the weighted average w_avg(ig) obtained from the four sub-band signals from sb-4 to sb-1 on the low-range side, a group power of the sub-band sb is estimated. This value equals the reference value b, and is called "envelope reference value, fenv(ig)". In the present embodiment, this value is determined by multiplication with a user-designated envelope reference adjusting value b_lev. Namely, the envelope reference value is not determined uniquely, but there is provided with a user-controllable envelope reference adjusting function.

[Formula 6]

$$fenv(ig) = \text{w\_avg}(ig) * \text{b\_lev} \tag{6}$$

$$\left(\begin{array}{l} fenv\text{: envelop reference value} \\ \text{b\_lev: envelop reference adjusting value} \end{array}\right)$$

In the present embodiment, the envelope reference adjusting value b_lev is in a range from 0.25 to 1.0, both inclusive, or may be set arbitrary by the user therewithin. In the present embodiment, the envelope reference adjusting value b_lev is set to 0.5 as a recommendable value based on frequency envelopes obtained by statistically analyzing typical music data. However, the range of the envelope reference adjusting values b_lev may be changed in response to the band dividing number, the extension start frequency band sb, or the like.

Limitation of Envelope Reference Values

The envelope reference values fenv(ig), may become an extremely large value depending on the weighted average w_avg(ig) or an extension strength e_lev. Thus, when the band combining section combines sub-band signals, the resultant band-combined output signal may likely to overflow. In view of this situation, in the present embodiment, overflow of the output signal is prevented by applying a limiter to the envelope reference value fenv(ig) so that the value will not take an extremely large value.

Figure 7:
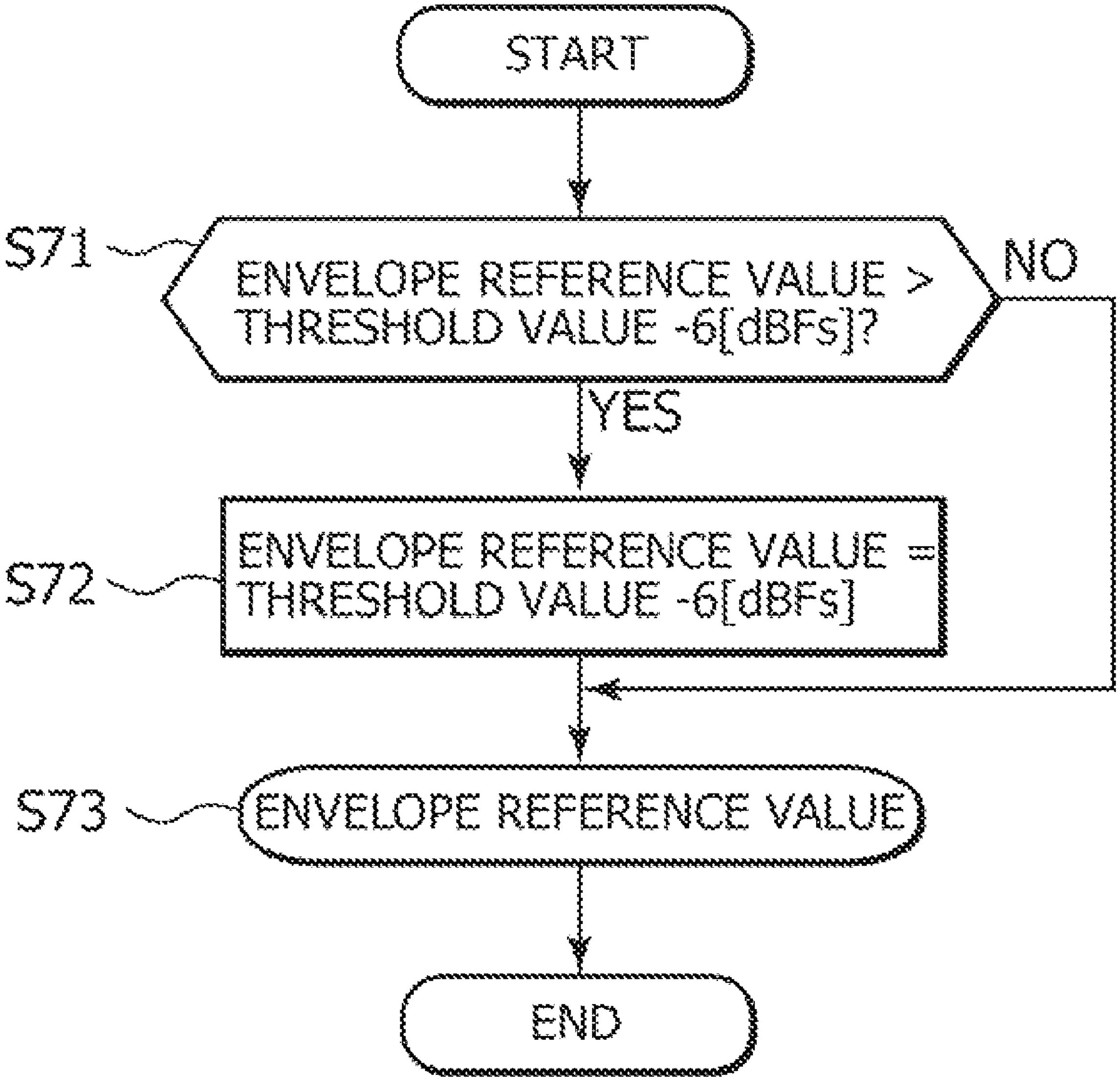
FIG. 7 is a flowchart showing a processing flow for limiting an envelope reference value.

FIG. 7 is a flowchart showing a processing flow for limiting an envelope reference value. Also, FIGS. 8A and 8B are schematic diagrams each showing how an envelope reference value is limited.

Figure 8A:
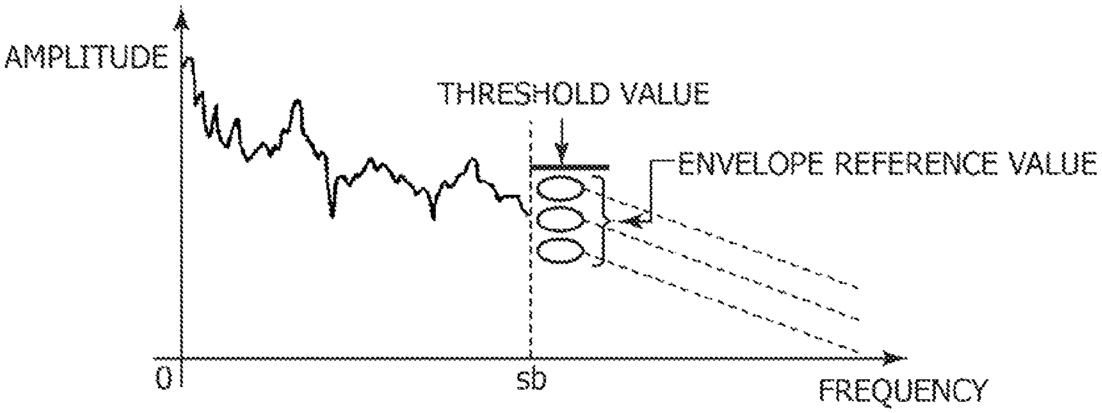
FIGS. 8A and 8B are schematic diagrams each showing how the envelope reference value is limited.
Figure 8B:
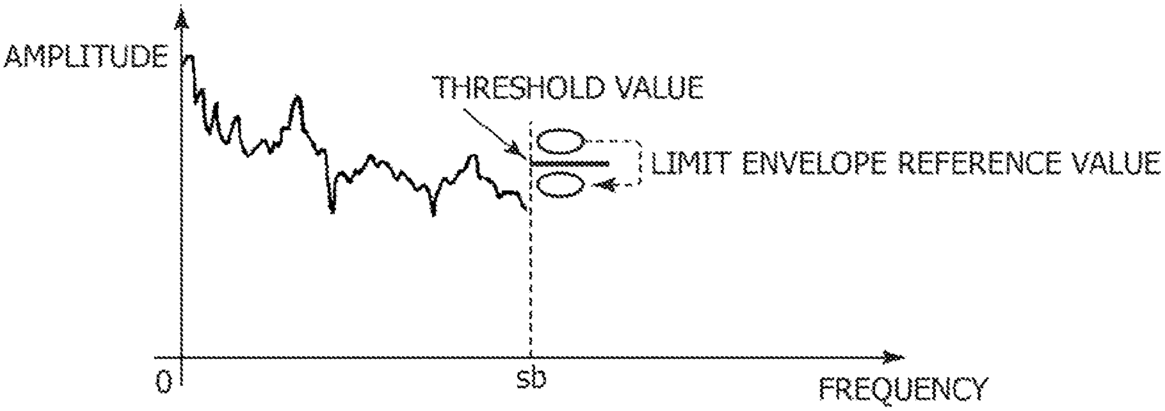

In step S71, if an envelope reference value fenv(ig) is larger than a threshold value-6[dBFs] (=16384^2*nslot(ig)), the process proceeds to step S72 to forcibly damp the value to a level equal to the threshold value as shown in FIG. 8B.

On the other hand, if it is judged in step S71 that an envelope reference value fenv(ig) is equal to or less than the threshold value −6[dBFs] (=16384^*nslot(ig)), the process proceeds to step S73, to directly use the envelope reference value fenv(ig) as shown in FIG. 8A.

It should be noted that, in the present embodiment, the threshold value for limiting the envelope reference value fenv (ig) is set to −6[dBFs]. Alternatively, the value may be changed in response to the band dividing number, the extension start frequency band sb, or the like.

[Formula 7]

$$fenv(ig)>16384\hat{\ }2*nslot(ig)\ldots fenv(ig)=16384\hat{A}2*nslot(ig) \quad (7)$$

$$fenv(ig)\leqq 16384\hat{\ }2*nslot(ig)\ldots nslot(ig)=fenv(ig) \quad (8)$$

Determination of Envelope Values on High-Range Side

Envelope values env(ib,ig) for the sub-bands from sb to 15 on the high-range side, are calculated by multiplying the slope a with the envelope reference values fenv (ig). The slope a is determined by the envelope slope value a_lev. In the present embodiment, the slope is not determined uniquely, but there is provided with a user-controllable envelope slope adjusting function.

[Formula 8]

$$env(ib+1,ig)=env(ib,ig)*a\_lev(env(sb,ig)=fenv(ig)) \quad (9)$$

(a_lev: envelop slope value)

In the present embodiment, an envelope slope value a_lev is in a range from 0.25 to 1.0, both inclusive, and may be set arbitrary by the user therewithin. In the present embodiment, the envelope slope value a_lev is set to 0.5 as a recommendable value based on frequency envelopes obtained by statistically analyzing typical music data. However, the range of the envelope slope values a_lev may be changed in response to the band dividing number, the extension start frequency band sb, or the like.

Envelope values env(ib,ig) in the low-range sub-bands is synonymous with group powers tpow(ib,ig), and the group powers for the extension bands on the low-range side are set as envelope values on the low-range side.

[Formula 9]

$$env(ib,ig)=tpow(ib,ig)(ib<sb) \quad (10)$$

The envelope values env(ib,ig) for the sub-band signals from sb-4 to sb-1 on the low-range side, supplied from the time classifying section 13 and the envelope values env (ib,ig) for the sub-bands from sb to 15 on the high-range side, obtained from the above-mentioned process are supplied to the band interpolating section 15.

Band Interpolating Section

At the band interpolating section 15, gains of the sub-band signals from sb-4 to sb-1 on the low-range side are adjusted to interpolate the sub-band signals from sb to 15 on the high-range side. A mapping pattern for each pair of sub-bands is uniquely determined by sb.

[Formula 10]

$$\text{sb\_map}(ib) = ib - 4 * INT\left(\frac{ib - sb}{4} + 1\right) \quad (11)$$

$$ib = sb,\ sb+1,\ sb+2 \ldots 15$$

$$\left(\begin{array}{l}\text{sb\_map: mapping source } subband \\ ib\text{: current } subband \\ sb\text{: extension start frequency band}\end{array}\right)$$

By finding the square root of a quotient, which is obtained by dividing an envelope value env(ib,ig) for each of the sub-bands from sb to 15 on the high-range side supplied from the envelope estimating section 14, by an envelope value env (sb_map(ib),ig) for each of the sub-bands sb_map(ib) on the low-range side from sb-4 to sb-1 which contain source signals for the sub-bands ib, gain adjusting coefficients, gain(ib,ig), for the sub-bands from sb to 15 on the high-range side are obtained.

[Formula 11]

$$\text{gain}(ib, ig) = \sqrt{\frac{env(ib, ig)}{env(\text{sb\_map}(ib), ig)}} \quad (12)$$

(gain: gain adjusting coefficient)

Subsequently, the gain adjusting coefficients gain (ib,ig) for the sub-bands from sb to 15 on the high-range side, obtained from the formula (12) are supplied to the high frequency generating section 16.

High Frequency Generating Section

The high frequency generating section 16 is supplied with sub-band signals x(ib,n) from sb-4 to sb-1 on the low-range side from the band dividing section 12 as input, and also supplied with the gain adjusting coefficients gain(ib,ig) for the sub-bands from sb to 15 on the high-range side from the band interpolating section 15. By multiplying the gain adjusting coefficients gain(ib,ig) for the sub-bands from sb to 15 on the high-range side with the sub-band signals x(sb_map(ib), n) from sb-4 to sb-1 on the low-range side serving as the source signals, sub-band signals x(ib,n) from sb to 15 on the high-range side are obtained.

[Formula 12]

$$x(ib,n)=\text{gain}(ib,ig)*x(sb\_\text{map}(ib),n) \quad (13)$$

Subsequently, the sub-band signals x(ib,n) on the high-range side from sb to 15 obtained from the formula (13) are supplied to the phase adjusting section 17.

Phase Adjusting Section

The sub-band signals x(ib,n) from sb to 15 on the high-range side supplied from the band interpolating section 15 are generated from the four sub-band signals x(sb_map(ib),n) from sb-4 to sb-1 on the low-range side. Accordingly, time-domain signal peaks appear at the same timings in both the low-range sub-band signals and the high-range sub-band signals. If all the sub-bands are added together by combining at locations having peaks that occur at the same timings, overflow may occur in the resultant band-combined output signal in some cases.

In view of the above, the phase adjusting section 17 supplies the low-range sub-band signals and the high-range sub-band signals after shifting their peaks, to the band combining section 18, in order to prevent such overflow.

Figure 9:
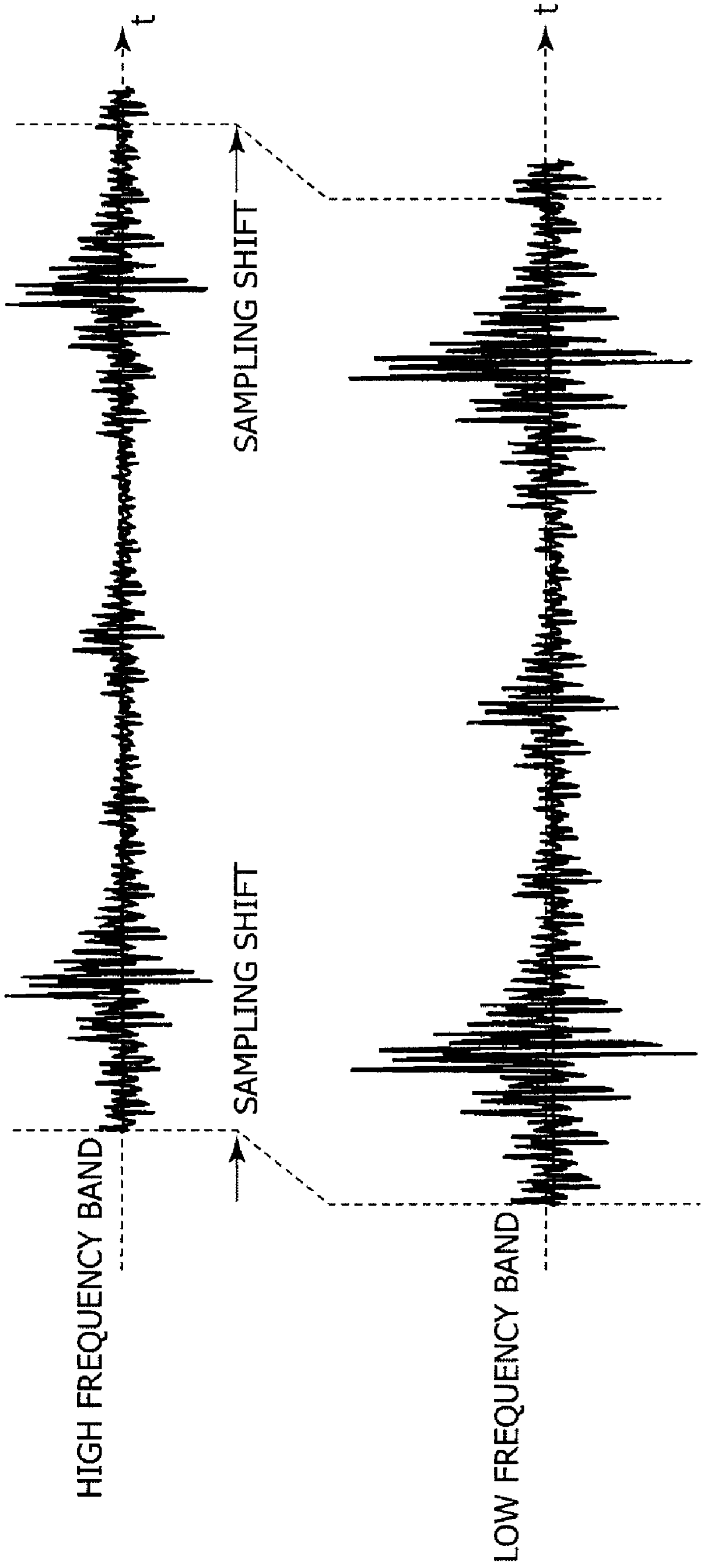
FIG. 9 is a schematic diagram showing how a phase adjustment is made for low-range sub-band signals and high-range sub-band signals.
Figure 10:
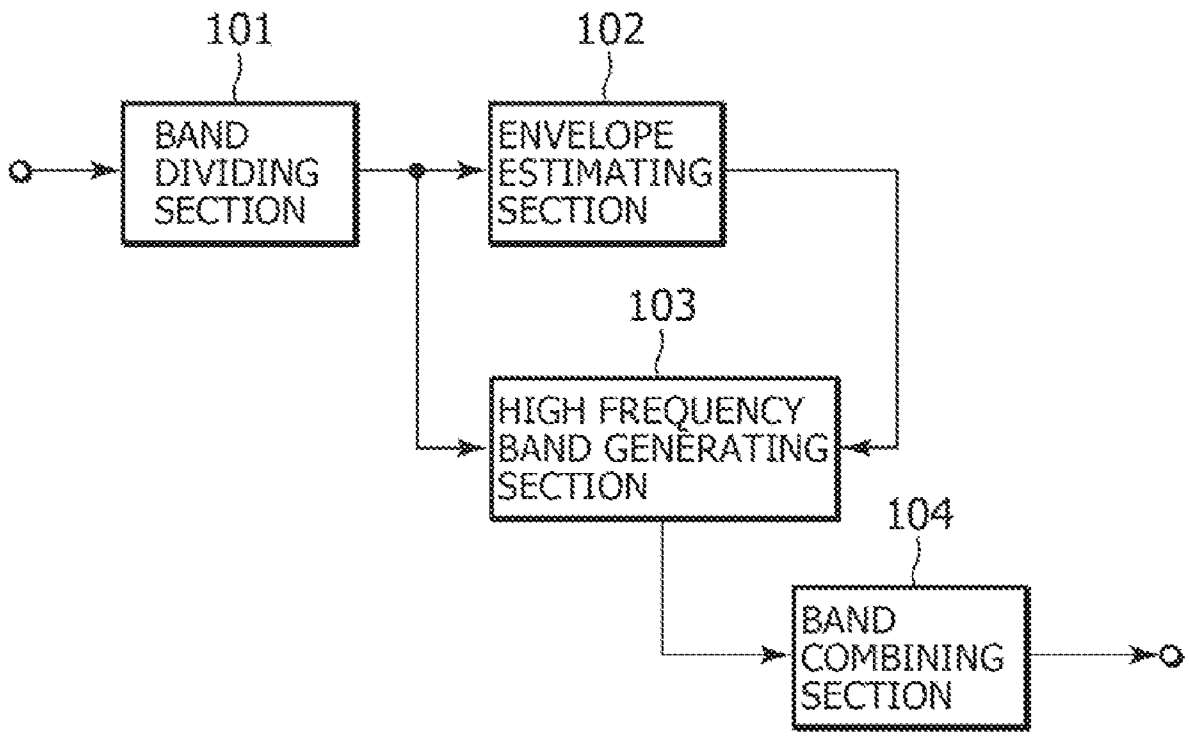
FIG. 10 is a block diagram showing a configuration of a frequency band extending apparatus according to a related-art technique.

FIG. 9 is a schematic diagram showing how the low-range sub-band signals and the high-range sub-band signals are phase-adjusted. Here, the sub-band signals x(ib,n) from sb to 15 on the high-range side are shifted backward by four samples along the time axis. Namely, in the present embodiment, by utilizing the backward temporal masking feature observed in the human auditory system, the sub-band signals x(ib,n) are delayed in the temporal direction within the inaudible range.

[Formula 13]

$$x(ib,n)=x(ib,n-4) \quad (14)$$

It should be noted that a delay by four samples is implemented here. However, the delay by four samples may be changed in response to the band dividing number, the extension start frequency band sb, the sampling frequency, or the like.

The phase adjusting section 17 supplies the sub-band signals x(ib,n) on the high-range side from sb to 15 obtained by sample-shifting, to the band combining section 18.

Band Combining Section

The band combining section 18 combines bands of the sub-band signals x(ib,n) from sb to 15 on the high-range side supplied thereto from the phase adjusting section 17, with the sub-band signals x(ib,n) from 0 to sb-1 on the low-range side supplied thereto from the band dividing section 12, by a filter bank, to obtain a band-combined output signal y(n).

As described in the foregoing, in the present embodiment, sb is determined in accordance with side information, and then a frequency band is extended on the basis of a plurality of sub-band signals on a side lower than sb. Accordingly, a signal, in which a signal component belonging to a higher frequency band is deleted, can be played with higher sound quality. In addition, code corruption in the sub-band signals from sb-4 to sb-1 on the low-range side is detected, and the transient detection is then performed on the sub-band signals from sb-4 to sb-1 on the low-range side in accordance with the corruption detection result. Accordingly, the calculation volume for the transient detection can be prevented from increasing. Furthermore, by averaging the frequency envelopes by assigning larger weights to the sub-band signals from sb-4 to sb-1 on the low-range side closer to the high-range side, the frequency envelope of the low-range side can be connected to that of the high-range side more smoothly. Furthermore, by performing band-combining while applying a limiter to the envelope reference value calculated from the sub-band signals from sb-4 to sb-1 on the low-range side, overflow of a band-combined output signal can be prevented. Furthermore, by phase-shifting a plurality of signals belonging to sub-bands from sb to 15 with respect to a plurality of sub-band signals on the low-range side from 0 to sb-1 for band combination, overflow of the band-combined output signal can be prevented.

It should be noted that the present invention is not limited only to the above-mentioned embodiment, but may, of course, be modified in various ways without departing from the scope of the present invention. In the present embodiment, the frequency band extending apparatus for processing a signal after decoding processing has been described as an example. Alternatively, the present invention may also be applicable to a player apparatus provided with decoding means. In addition, in the above-mentioned embodiment, a hardware configuration is disclosed, but the present invention is not limited thereto. The present invention may be realized by causing a CPU (Central Processing Unit) to execute arbitrary processing as a computer program. In this case, the computer program can be provided as recorded on a recording medium, or can alternatively be provided by transmission via the Internet or other transmission media.

The present application contains subject matter related to Japan Patent Application JP 2006-304501 filed in the Japan Patent Office on Nov. 9, 2006, the entire contents of which being incorporated herein by reference.

What is claimed is:

1. A frequency band extending apparatus for extending a frequency band of an input signal, comprising:

an extension control device configured to determine an extension start band for the input signal;

a band dividing device configured to divide the input signal into a plurality of sub-band signals, wherein the frequency band is extended based on a plurality of sub-band signals on a side higher than the extension start band obtained by multiplying a plurality of sub-band signals on a side lower than the extension start band with gain adjusting coefficients determined for sub-band signals on a side higher than the extension start band, wherein the plurality of sub-band signals on a side lower than the extension start band immediately precedes the extension start band;

a transient detecting device configured to subject a predetermined number of the sub-band signals on a side lower than the extension start band and preceding the extension start band to transient detection in a temporal direction; and a group dividing device configured to divide the predetermined number of sub-band signals into a plurality of groups in the temporal direction, based on a transient detection result generated by the transient detecting device.

2. The frequency band extending apparatus according to claim 1, comprising:

a band combining device configured to combine the plurality of sub-band signals on the side lower than the extension start band with the plurality of the sub-band signals equal to or higher than the extension start band.

3. The frequency band extending apparatus according to claim 2, wherein the band combining device combines the plurality of sub-band signals on the side lower than the extension start band with the plurality of the sub-band signals equal to or higher than the extension start band, with shifting of their phases.

4. The frequency band extending apparatus according to claim 1, wherein the extension control device determines the extension start band for the input signal by using information related to the input signal as side information.

5. The frequency band extending apparatus according to claim 1, wherein the transient detecting device detects code corruption of the predetermined number of sub-band signals and subjects the predetermined number of sub-band signals to transient detection in response to the code corruption detection result.

6. The frequency band extending apparatus according to claim 1, comprising:

a power average calculating device configured to calculate an average of powers of the predetermined number of sub-band signals, on the basis of averages of group powers for the groups into which the predetermined number of sub-band signals are divided by the group dividing device;

an envelope estimating device configured to extrapolate an envelope linear line for the plurality of sub-band signals equal to or higher than the extension start band, with the average calculated by the power average calculating device as a starting point; and a band interpolating device configured to extrapolate the plurality of sub-band signals equal to or higher than the extension start band, on the basis of the envelope linear line.

7. The frequency band extending apparatus according to claim 6, wherein the power average calculating device calculates the average of powers of the predetermined number of sub-band signals by assigning larger weights to the predetermined number of sub-band signals closer to a high-range side.

8. The frequency band extending apparatus according to claim 6, wherein the envelope estimating device extrapolates the envelope linear line using a threshold value as the starting point if the average calculated by the power average calculating means is greater than the threshold value.

9. A frequency band extending method for extending a frequency band of an input signal, comprising:

determining an extension start band for the input signal in accordance with information relating to the input signal;

dividing the input signal into a plurality of sub-band signals;

extending a frequency band based on a plurality of sub-band signals on a side higher than the extension start band obtained by multiplying a plurality of sub-band signals on a side lower than the extension start band with gain adjusting coefficients determined for sub-band signals on a side higher than the extension start band, wherein the plurality of sub-band signals on a side lower than the extension start band immediately precedes the extension start band;

subjecting a predetermined number of the sub-band signals on a side lower than the extension start band and preceding the extension start band to transient detection in a temporal direction; and dividing the predetermined number of sub-band signals into a plurality of groups in the temporal direction, based on a transient detection result.

10. A non-transitory computer readable recording medium storing instructions that when executed cause a computer to execute a process of playing an input signal after band-extending the input signal is recorded, the process comprising:

determining an extension start band for the input signal;

dividing the input signal into a plurality of sub-band signals;

extending the frequency band based on a plurality of sub-band signals on a side higher than the extension start band obtained by multiplying a plurality of sub-band signals on a side lower than the extension start band with gain adjusting coefficients determined for sub-band signals on a side higher than the extension start band, wherein the plurality of sub-band signals on a side lower than the extension start band immediately precedes the extension start band;

subjecting a predetermined number of the sub-band signals on a side lower than the extension start band and preceding the extension start band to transient detection in a temporal direction; and dividing the predetermined number of sub-band signals into a plurality of groups in the temporal direction, based on a transient detection result.

11. A frequency band extending apparatus for extending a frequency band of an input signal, comprising:

an extension control device configured to determine an extension start band for the input signal in accordance with information relating to the input signal;

a band dividing device configured to divide the input signal into a plurality of sub-band signals;

a transient detecting device configured to subject a predetermined number of sub-band signals preceding the extension start band, to transient detection in a temporal direction, among a plurality of the sub-band signals on a side lower than the extension start band into which the input signal is band-divided by the band dividing device;

a group dividing device configured to divide the predetermined number of sub-band signals into a plurality of groups in the temporal direction on the basis of a transient detection result generated by the transient detecting device;

a power average calculating device configured to calculate an average of powers of the predetermined number of sub-band signals on the basis of averages of group powers for the groups into which the predetermined number of sub-band signals is divided by the group dividing device;

an envelope estimating device configured to extrapolate an envelope linear line for a plurality of the sub-band signals equal to or higher than the extension start band, with the average calculated by the power average calculating device as a starting point;

a band interpolating device configured to extrapolate the plurality of the sub-band signals equal to or higher than the extension start band on the basis of the envelope linear line; and a band combining device configured to combine the plurality of sub-band signals on the side lower than the extension start band, with the plurality of sub-band signals equal to or higher than the extension start band, wherein the frequency band is extended based on a plurality of sub-band signals on a side higher than the extension start band obtained by multiplying a plurality of sub-band signals on a side lower than the extension start band with gain adjusting coefficients determined for sub-band signals on a side higher than the extension start band; wherein the plurality of sub-band signals on a side lower than the extension start band immediately precedes the extension start band.

* * * * *